United States Patent [19]
Cho

[11] Patent Number: 6,054,332
[45] Date of Patent: Apr. 25, 2000

[54] METHOD FOR FABRICATING CAPACITOR OF SEMICONDUCTOR MEMORY DEVICE

[75] Inventor: Ho Jin Cho, Kyoungki-do, Rep. of Korea

[73] Assignee: Hyundai Electronics Industries Co., Ltd., Kyoungki-do, Rep. of Korea

[21] Appl. No.: 09/414,236

[22] Filed: Oct. 7, 1999

[30] Foreign Application Priority Data

Oct. 9, 1998 [KR] Rep. of Korea ........................ 98-42219

[51] Int. Cl.$^7$ .................................................. H01L 21/00
[52] U.S. Cl. ................................ 438/3; 438/240; 438/681
[58] Field of Search ................................ 438/3, 240, 250, 438/253, 393, 396, 681, 686, 650

[56] References Cited

U.S. PATENT DOCUMENTS

| | | | |
|---|---|---|---|
| 5,629,229 | 5/1997 | Si et al. | 438/3 |
| 5,877,062 | 3/1999 | Horii | 438/253 |
| 5,962,069 | 10/1999 | Schlinder et al. | 438/3 |
| 5,994,153 | 11/1999 | Nagel et al. | 438/3 |

*Primary Examiner*—Tuan H. Nguyen
*Attorney, Agent, or Firm*—Ladas & Parry

[57] ABSTRACT

The present invention provides a method for fabricating a capacitor of a semiconductor memory device to improve the characteristic of step coverage during depositing upper electrode, and simultaneously to prevent impurities remained between upper electrode and high dielectric layer.

The method for fabricating capacitor of a semiconductor memory device comprises the steps of: forming an intermetal insulating layer having a contact hole for exposing a junction region on a semiconductor substrate provided with the junction region; forming a contact plug within the contact hole; forming a barrier layer on the contact plug and on the adjoining intermetal insulating layer; forming a lower electrode so as to surround the barrier layer; forming a high dielectric layer on the intermetal insulating layer formed on the lower electrode; forming an upper electrode on the high dielectric layer according to the MOCVD method; and crystallizing the lower electrode, the high dielectric layer and the upper electrode, wherein in the step of forming the upper electrode, a step of supplying precursors used for forming the upper electrode for a selected time, and a step of interrupting the supply of precursors for a selected time are repeated at least one time.

20 Claims, 4 Drawing Sheets

METHOD FOR FABRICATING CAPACITOR OF SEMICONDUCTOR MEMORY DEVICE

FIELD OF THE INVENTION

This invention relates to a method for fabricating a semiconductor memory device, and more particularly to a method for fabricating a capacitor of semiconductor memory device capable of improving interface characteristic between an upper electrode of capacitor of high dielectric memory device and a dielectric layer.

BACKGROUND OF THE INVENTION

As the DRAM device is highly integrated, it is required to obtain a capacity over 25 fF within a small cell dimension. Currently used ONO dielectric evolves limitations of manufacturing process.

Therefore, it is required an alternative technology for manufacturing capacitors using the high dielectrics capable of obtaining high capacity within the small cell dimension. gAs for the high dielectric film, there are $(BaSr)TiO_3$ hereinafter "BST", $BaTiO_3$ and $SrTiO_3$.

FIG. 1 is a cross-sectional view for illustrating a method for fabricating a semiconductor memory device having a high dielectric layer as a capacitor insulating layer.

Referring to FIG. 1, an intermetal insulating layer 11 is formed on a semiconductor substrate 10 provided with a junction region 10a. The intermetal insulating layer 11 is etched to expose the junction region 10a, thereby forming a contact hole H. A contact plug 12 made of an impurity-doped polysilicon layer is formed within the contact hole H according to a known technique. A barrier metal layer 13 consisting of titanium 13a, titanium nitride 13b is deposited on the contact plug 12 and the intermetal insulating layer 11. The barrier metal layer 13 is patterned so that the barrier metal layer 13 is remained on and around the contact plug 12. A Pt metal layer for lower electrode is deposited on the intermetal insulating layer 11 in which the barrier metal layer 13 is formed, and then selected portions of the Pt metal layer is patterned and becomes a lower electrode 14. A high dielectric layer 15 is formed on the intermetal insulating layer 11 in which the lower electrode 14 is formed. A Pt metal layer for upper electrode is formed on the high dielectric layer 15 according to sputtering method. Next, selected portions of the high dielectric layer 15 and the Pt metal layer are patterned thereby forming an upper electrode 16.

In current giga DRAM devices, when the high dielectric layer 15 is deposited by thickness of 100~1000, distance between adjacent capacitors is approximately 0.12 $\mu$m. Thus, aspect ratio between the respective capacitors is almost 2. Therefore, it is very difficult to deposit uniformly the Pt metal layer for forming the upper electrode on the high dielectric layer 15. In particular, the Pt metal layer for forming upper electrode is currently formed by the sputtering method having inferior characteristic of step coverage, therefore the Pt metal layer is deposited ununiformly on the high dielectric layer 15.

To solve the foregoing problem, there has been suggested another conventional method for forming the Pt metal layer, a MOCVD (metal organic chemical vapor deposition) method having excellent characteristic of step coverage.

When the Pt metal layer is deposited according to the MOCVD method, precursors such as Pt $(C_5H_7O_2)_2$, $(C_5H_5)$ Pt $(CH_3)_3$, $(CH_3C_5H_4)$ Pt $(CH_3)_3$ and $Pt(C_5HF_6O_2)_2$ are used. However, when the Pt metal layer is deposited by using those precursors, impurities such as carbon, oxygen and hydrogen consisting the precursors are remained at an interface between the Pt metal layer and the high dielectric layer. Those impurities form an electronic trap at the interface of the Pt metal layer and the high dielectric layer. Therefore, a leakage current is increased in the high dielectric layer thereby deteriorating electrical characteristics of the capacitor.

SUMMARY OF THE INVENTION

Accordingly, the object of the present invention is to improve the characteristic of step coverage of the upper electrode, and simultaneously to prevent occurring impurities between the upper electrode and the high dielectric layer.

To accomplish the foregoing object, in one aspect, the present invention provides a method comprising the steps of: forming a lower electrode on a semiconductor substrate provided with lower layers; forming a dielectric layer on the lower electric layer; and forming an upper electrode on the dielectric layer according to a MOCVD method, wherein in the step of forming the upper electrode, a step of supplying precursors used for forming the upper electrode for a selected time, and a step of interrupting the supply of precursors for a selected time are repeated at least one time.

In another aspect, the present invention provides a method comprising the steps of: forming an intermetal insulating layer having a contact hole for exposing a junction region on a semiconductor substrate provided with the junction region; forming a contact plug within the contact hole; forming a barrier layer on the contact plug and on the adjoining intermetal insulating layer; forming a lower electrode so as to surround the barrier layer; forming a high dielectric layer on the intermetal insulating layer formed on the lower electrode; forming an upper electrode on the high dielectric layer according to the MOCVD method; and crystallizing the lower electrode, the high dielectric layer and the upper electrode, wherein in the step of forming the upper electrode, a step of supplying precursors used for forming the upper electrode for a selected time, and a step of interrupting the supply of precursors for a selected time are repeated at least one time.

DETAILED DESCRIPTION OF THE PREFERRED EMBODIMENTS

Figure 1:
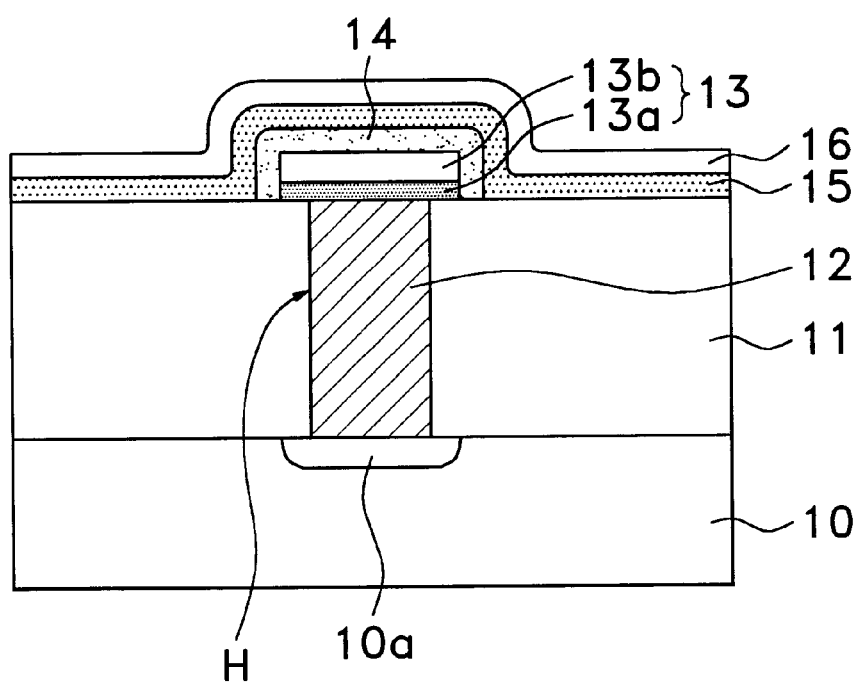
FIG. 1 is a cross-sectional view showing a method for fabricating a semiconductor memory device having a high dielectric layer as a capacitor insulating layer.
Figure 2A:
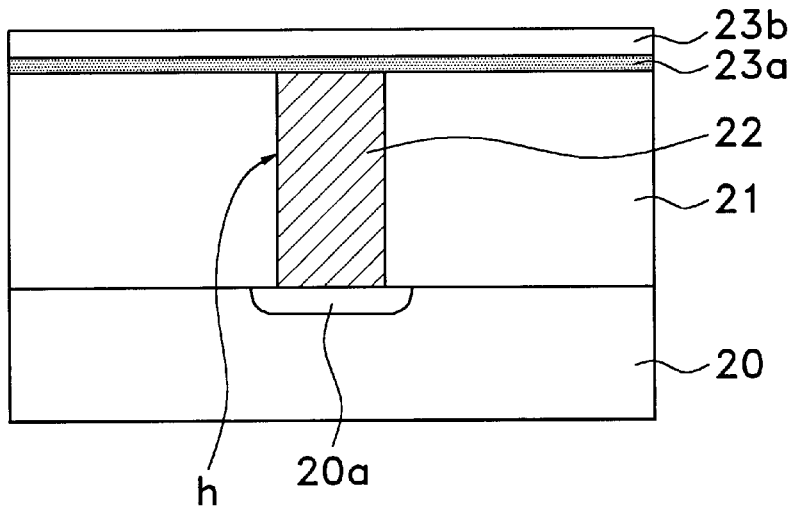
FIGS. 2A to 2F cross-sectional views showing a method for fabricating a semiconductor memory device having a high dielectric layer as a capacitor insulating layer according to the present invention.

Referring to FIG. 2A, an intermetal insulating layer 21 is formed on a semiconductor substrate 20 provided with a junction region 20a. A selected portion of the intermetal insulating layer 21 is etched to expose the junction region 20a thereby forming a contact hole h. An impurity-doped polysilicon layer is deposited on the intermetal insulating layer 21. Next, the polysilicon layer is etched-back until a surface of the intermetal insulating layer 21 is exposed thereby forming a contact plug 22. A first barrier layer 23a and a second barrier layer 23b are successively deposited on the contact plug 22 and the intermetal insulating layer 21.

Herein, the first barrier layer 23a is formed of a layer selected from Ti layer, Ta layer, W layer or Zr layer, and the second barrier layer 23b is formed of a layer selected from TiN layer, TaN layer, WN layer or TaSiN layer.

Figure 2B:
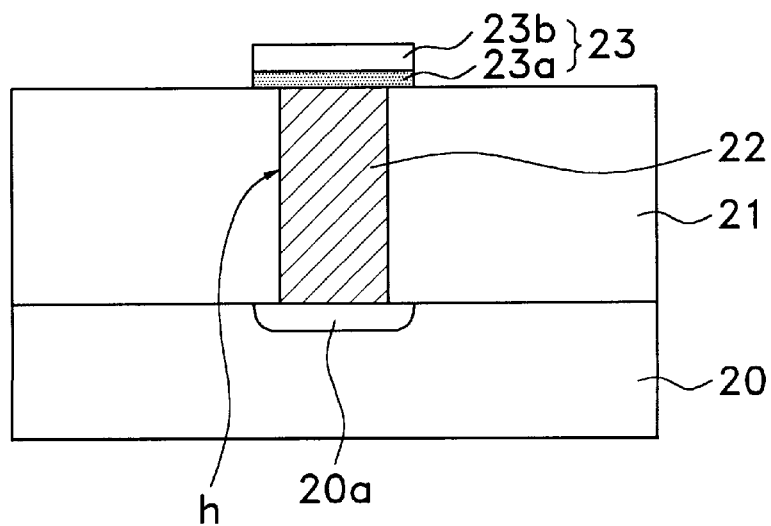

Referring to FIG. 2B, selected portions of the second barrier layer 23b and the first barrier layer 23a are patterned to be remained on and around the contact plug 22 thereby forming a barrier layer 23.

Figure 2C:
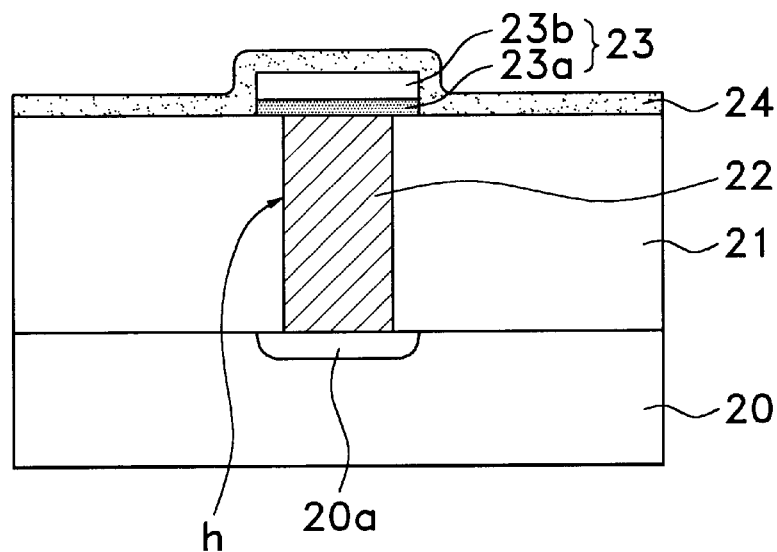

As shown in FIG. 2C, a first Pt layer 24 is formed by thickness of approximately 500~5000 Å on the intermetal insulating layer 21 on which the barrier layer 23 is formed.

Figure 2D:
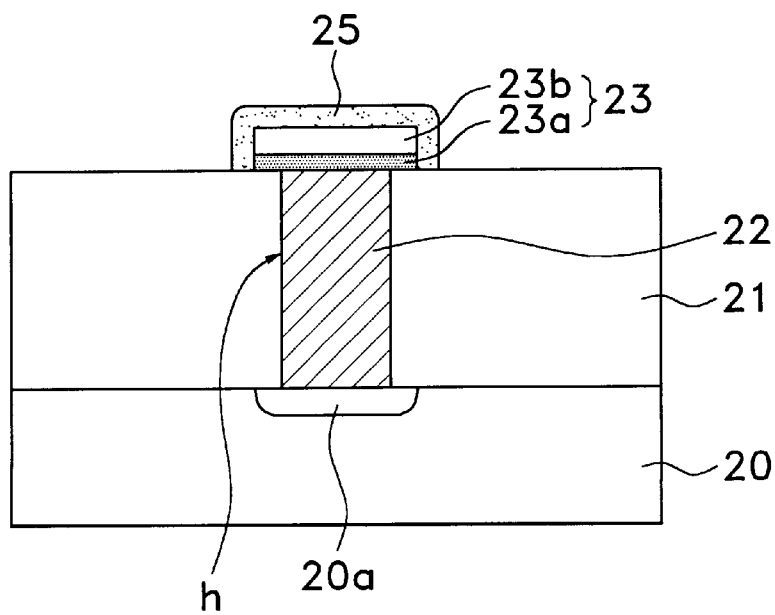

Referring to FIG. 2D, a selected portion of the first Pt layer 24 is patterned and then becomes a lower electrode 25. More preferably, the first Pt layer 24 is patterned to surround the barrier layer 23.

Figure 2E:
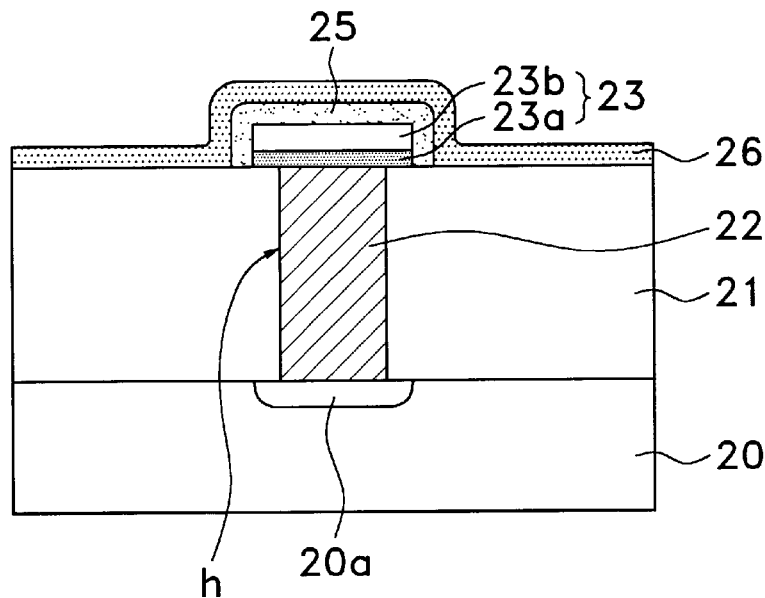

Continuously, as shown in FIG. 2E, a high dielectric layer 26 is formed by thickness of approximately 50~500 Å on the lower electrode 25 and the intermetal insulating layer 21. Herein, a BST layer, for example, is used for the high dielectric layer 26 and is formed in temperature range of approximately 350~500° C.

Figure 2F:
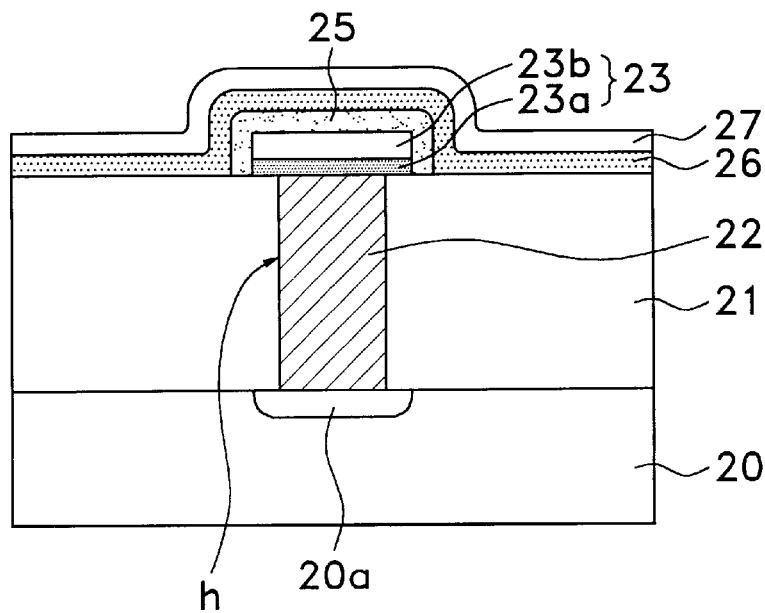

Referring to FIG. 2F, a second Pt layer 27 for upper electrode is deposited on the high dielectric layer 26. One selected from Pt $(C_5H_7O_2)_2$, $(C_5H_5)Pt(CH_3)_3$, $(C_2H_5C_5H_4)Pt(CH_3)_3$, $(CH_3C_5H_4)Pt(CH_3)_3$, and $Pt(C_5HF_6O_2)_2$ can be used as a precursor for the second Pt layer 27. In order to improve the characteristic of step coverage, the second Pt layer 27 is fabricated under temperature of 250~400° C. and pressure condition of 0.5~10 Torr according to the MOCVD method. Herein, as a conveying gas for conveying the vaporized precursors within a reactor, Ar or $N_2$ gas is used, and $O_2$ or $H_2$ gas is used as an atmospheric gas for dissolving the precursors. Furthermore, during depositing the second Pt layer 27, so as to prevent residues between the second Pt layer 27 and the high dielectric layer 26, precursors of Pt are supplied for a selected time and the supply is interrupted for a while. This process is performed repeatedly. More preferably, the precursors of Pt are supplied for 5~60 seconds and the supply is interrupted for 5~60 seconds, and then this process is repeated for multitude times. Then, since the oxygen pressure is increased in the reactor chamber during the supply of precursor is interrupted, dissolving reaction of precursor ingredients absorbed between the high dielectric layer 26 and the second Pt layer 27 is accelerated, impurities such as carbon and hydrogen are easily separated in the air, and then the Pt metal ingredients are deposited.

Accordingly, the amount of impurities contained in the precursors between the high dielectric layer 26 and the second Pt layer 27 is decreased. Afterward, a resultant on the semiconductor substrate is treated under $N_2$, $O_2$, $N_2O$ or their mixture gas atmosphere according to rapid thermal annealing process or furnace annealing process so that the second Pt layer 27 for upper electrode, the high dielectric layer 26 and the lower electrode 25 are crystallized. At this time, the annealing process is performed at temperature of 400~1000° C. for 1~60 minutes. And then, the second Pt layer 27 and the high dielectric layer 26 are patterned in a selected shape thereby forming an upper electrode.

The upper electrode in the above embodiment is formed of the Pt layer. However, an Ir layer also can be used as the upper electrode. Similar to the Pt layer, during depositing the Ir layer, precursors such as Ir $(C_3H_5)$, Ir $(C_5H_5CH_3)$ $(C_8H_{12})$, Ir $(C_5H_5)$ $(C_8H_{12})$ are repeatedly supplied for a selected time and the supply is interrupted for a while.

Moreover, an Ru layer can be used as the upper electrode. During depositing the Ru layer, precursors such as $Ru(C_2H_5C_5H_4)_2$, $Ru(CH_{13}O_2)_3$, $Ru(CO)_{12}$, $Ru(C_{11}H_{19}O_2)_3$ are repeatedly supplied for a selected time and the supply is interrupted for a while.

As described in the above description, according to the present invention, the precursors of upper electrode are repeatedly supplied and the supply is interrupted for a while during forming the upper electrode. Then, during interrupting the supply of precursors, since the oxygen pressure is increased in the reactor chamber during the supply of precursor is interrupted, dissolving reaction of precursor ingredients absorbed between the high dielectric layer and the second Pt layer is accelerated, impurities such as carbon and hydrogen are easily separated in the air, and then the Pt metal ingredients are deposited. Therefore, a trap density of the upper electrode and the high dielectric layer, and a defect of dielectric layer are decreased. Consequently, the leakage current of capacitor and the breakdown voltage and distribution thereof are improved. Furthermore, during interrupting the supply of precursor, gas carrying the precursors is not flowed into a reaction chamber. Then, oxygen partial pressure in the reaction chamber is increased, and oxidation of the interface between the upper Pt electrode particles(grains) is accelerated. As a result, interfacial energy between the upper electrode particles is decreased, and than an abrupt growing of grain is prevented during annealing process. Also, shortage of the upper electrode is prevented.

While the present invention has been described with reference to certain preferred embodiment, various other modifications will be apparent to and can be readily made by those skilled in the art without departing from the scope and spirit of the present invention.

What is claimed is:

1. A method for fabricating capacitor of semiconductor memory device comprising the steps of:

forming a lower electrode on a semiconductor substrate provided with lower layers;

forming a dielectric layer on the lower electrode layer; and forming an upper electrode on the dielectric layer according to a MOCVD(metal-organic chemical vapor deposition) method, wherein in the step of forming the upper electrode, a step of supplying precursors used for forming the upper electrode for a selected time, and a step of interrupting the supply of precursors for a selected time are repeated at least one time.

2. The method of claim 1, wherein the upper electrode is formed of one metal layer selected from Pt, Ir or Ru.

3. The method of claim 2, wherein when the upper electrode is formed of the Pt layer, precursor thereof are selected from $Pt(C_5HF_6P_2)_2$, $Pt(C_5H_7O_2)_2$, $(C_5H_5)Pt(CH_3)_3$, $(CH_3C_5H_4)Pt(CH_3)_3$, and $(C_2H_5C_5H_4)Pt(CH_3)_3$.

4. The method of claim 2, wherein when the upper electrode is formed of the Ir layer, precursor thereof is selected from $Ir(C_3H_5)$, Ir $(C_5H_5CH_3)$ $(C_8H_{12})$, Ir $(C_5H_5)$ $(C_8H_{12})$.

5. The method of claim 2, wherein when the upper electrode is formed of the Ru layer, precursor thereof is selected from $Ru_3(CO)_{12}$ or $Ru(C_{11}H_{19}O_2)_3$, $Ru(C_2H_5C_5H_4)_2$, $Ru(C_8H_{13}O_2)_3$.

6. The method of claim 1, wherein the upper is fabricated under temperature of 150~400° C. and pressure condition of 0.5~10 Torr.

7. The method of claim 1, wherein during forming the upper electrode, the precursors are supplied for 5~60 seconds and the supply is interrupted for 5~30 seconds.

8. The method of claim 1, wherein the dielectric layer is formed of a BST layer.

9. The method of claim 8, wherein the BST layer is formed at temperature of 350~500° C. with thickness of 50~500 Å.

10. The method of claim 1, after the step of forming the upper electrode, further comprising the steps of annealing so as to crystallize the lower electrode, the dielectric layer and the upper electrode.

11. The method of claim 9, wherein the annealing process is performed under $N_2$, $O_2$, $N_2O$ or their mixture gas atmosphere at temperature of 400~1000° C. for 1~10 minutes.

12. A method for fabricating capacitor of a semiconductor memory device comprising the steps of:

forming an intermetal insulating layer having a contact hole for exposing a junction region on a semiconductor substrate provided with the junction region;

forming a contact plug within the contact hole;

forming a barrier layer on the contact plug and on the adjoining intermetal insulating layer;

forming a lower electrode so as to surround the barrier layer;

forming a high dielectric layer on the intermetal insulating layer formed on the lower electrode;

forming an upper electrode on the high dielectric layer according to the MOCVD method; and crystallizing the lower electrode, the high dielectric layer and the upper electrode, wherein in the step of forming the upper electrode, a step of supplying precursors used for forming the upper electrode for a selected time, and a step of interrupting the supply of precursors for a selected time are repeated at least one time.

13. The method of claim 12, wherein the upper electrode is formed of one metal layer selected from Pt, Ir or Ru.

14. The method of claim 13, wherein when the upper electrode is formed of the Pt layer, precursor thereof is selected from Pt $(C_5HF_6P_2)_2$, $Pt(C_5H_7O_2)_2$, $(C_5H_5)Pt(CH_3)_3$, $(CH_3C_5H_4) Pt(CH_3)_3$, and $(C_2H_5C_5H_4)Pt(CH_3)_3$.

15. The method of claim 13, wherein when the upper electrode is formed of the Ir layer, precursor thereof is selected from $Ir(C_3H_5)$, Ir $(C_5H_5CH_3)$ $(C_8H_{12})$, Ir $(C_5H_5)$ $(C_8H_{12})$.

16. The method of claim 13, wherein when the upper electrode is formed of the Ru layer, precursor thereof is selected from $Ru_3(CO)_{12}$ or $Ru(C_{11}H_{19}O_2)_3$, $Ru(C_2H_5C_5H_4)_2$, $Ru(C_8H_{13}O_2)_3$.

17. The method of claim 12, wherein the upper electrode is fabricated under temperature of 150~400° C. and pressure condition of 0.5~10 Torr.

18. The method of claim 12, wherein during forming the upper electrode, the precursors are supplied for 5~60 seconds and the supply is interrupted for 5~30 seconds.

19. The method of claim 12, wherein the high dielectric layer is formed at temperature of 350~500° C. with thickness of 50~500 Å.

20. The method of claim 12, wherein the step of crystallizing the upper electrode, the high dielectric layer and the upper electrode is performed under $N_2$, $O_2$, $N_2O$ or their mixture gas atmosphere at temperature of 400~1000° C. for 1~10 minutes.

* * * * *